GALLIUM ARSENIDE SEMICONDUCTOR DOPED WITH CHROMIUM AND A SHALLOW ACCEPTOR IMPURITY

Filed Nov. 18, 1964

George R. Cronin
Robert W. Haisty
INVENTORS

BY John G. Graham
ATTORNEY

United States Patent Office 3,392,193

Patented July 9, 1968

3,392,193
GALLIUM ARSENIDE SEMICONDUCTOR DOPED WITH CHROMIUM AND A SHALLOW ACCEPTOR IMPURITY

Robert W. Haisty, Richardson, and George R. Cronin, Dallas, Tex., assignors to Texas Instruments Incorporated, Dallas, Tex., a corporation of Delaware Filed Nov. 18, 1964, Ser. No. 412,031
7 Claims. (Cl. 252—512)

ABSTRACT OF THE DISCLOSURE

Disclosed are semiconductor materials comprising gallium arsenide and minor proportions of chromium and a shallow acceptor impurity which may be selected for example from the group consisting of manganese, copper, magnesium, zinc, and cadmium.

Figure 1:
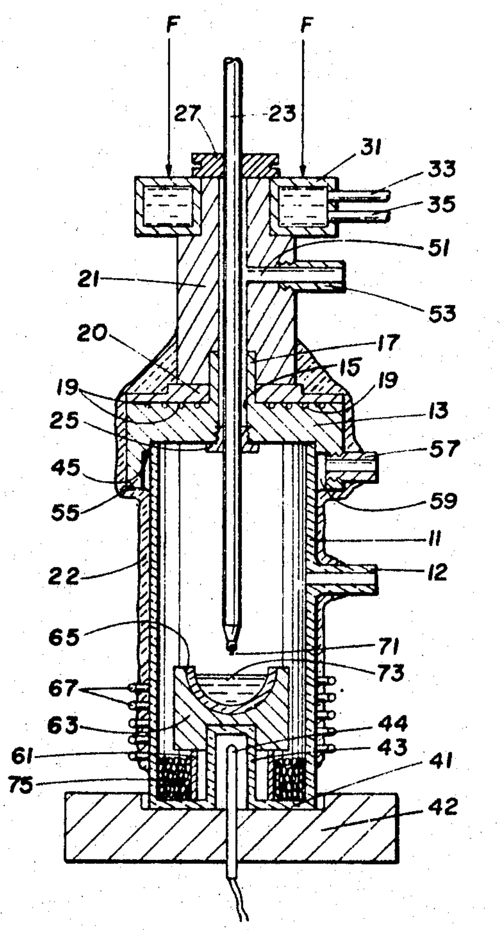

This invention relates to gallium arsenide, and particularly to gallium arsenide of relatively low resistivity having a relatively high energy level, a method of producing the same, and devices made therefrom.

The compound semiconductor gallium arsenide, because of its wide band gap and high electron mobility, has been used in making conventional semiconductor devices of improved quality as well as novel ones depending entirely on unique characteristics of gallium arsenide.

It is an object of the present invention to provide gallium arsenide semiconductor material which has electrical characteristics heretofore unknown in compound semiconductors, thus providing semiconductor material which may be used in novel semiconductor devices.

It is another object of the invention to provide gallium arsenide which is suitable for use as a thermistor.

It is a further object of the invention to provide a thermistor which is operable and has a high sensitivity over a temperature range from about 77° K. to about 600° K.

In accordance with this invention low resistivity gallium arsenide is provided which is controlled by an energy level or activation energy ($\Delta E$) about 0.3 electron volt from the valence band.

In a more specific aspect, this invention provides monocrystalline gallium arsenide containing a minor proportion of chromium and a minor proportion of a shallow acceptor impurity selected from the group well known as acceptor impurities in III–V compounds, such as manganese, copper, magnesium, zinc or cadmium. As used herein the term shallow acceptor includes all impurities which have an activation energy of approximately 0.1 ev. or less in gallium arsenide.

Ordinarily, when high purity gallium and arsenic are compounded to form gallium arsenide, the resultant material is of low resistivity and N-type conductivity due to residual donor impurities. Thus the addition of chromium, which acts in a manner comparable to an acceptor with a high energy level (approximately 0.75 ev.) in gallium arsenide, compensates the effect of the original donor, but does not itself provide low energy level carriers. Accordingly, gallium arsenide containing a minor proportion of chromium has a very high resistivity as described in copending application entitled "High Resistivity Gallium Arsenide and Process of Making Same," Ser. No. 311,430, filed Sept. 25, 1963, now Patent No. 3,344,071, in the name of George R. Cronin and assigned to the assignee of the instant application. It has since been discovered that the addition of a shallow acceptor impurity to the chromium-containing gallium arsenide described in the above-referenced copending application produces a new gallium arsenide material having electrical properties and characteristics totally unexpected and unexplained in view of the prior art. More specifically, the simultaneous addition of a shallow acceptor and chromium to gallium arsenide in amounts sufficient to compensate the original donor concentration (usually about $10^{15}$ carriers/cm.$^3$) produces a gallium arsenide semiconductor material having neither the characteristics of chromium-doped gallium arsenide nor the characteristics of shallow acceptor-doped gallium arsenide, but a material characterized by low room temperature resistivity controlled by an energy level about 0.3 electron volt (ev.) from the valence band. It should be noted that the characteristic 0.3 ev. energy level is intermediate that of chromium (approximately 0.75 ev.) and that of the shallow acceptors (approximately 0.1 ev.).

Figure 2:
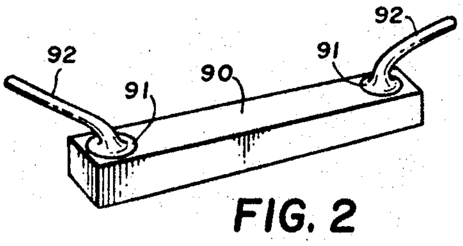

For a more complete understanding of the present invention and for further objects and advantages thereof, references may now be had to the following description, taken in conjunction with the appended claims and accompanying drawing, in which:

FIGURE 1 is a schematic diagram representing in cross-section an apparatus suitable for the manufacture of a crystal of gallium arsenide having the properties above indicated, and FIGURE 2 is a perspective veiw of a thermistor produced in accordance with the method of the invention.

Referring now to FIGURE 1, the apparatus illustrated therein includes a quartz chamber 11 which has a tubular side arm 12 to permit communication therethrough to the interior of the chamber. Lid 13, which is preferably made of boron nitride, covers the upper open portion of chamber 11. It has an aperture 15 which passes through its central portion and through the central portion of its upwardly extending hub 17. A resistance heater coil 19 is disposed along the upper portion of lid 13, which is preferably fitted with boron nitride retainer cap 20 to enclose said heater coil and hold it in position. Power is fed to coil 19 by suitable leads, not illustrated.

Upper annular cylindrical member 21 rides on hub 17, concentric therewith, and rests upon retainer cap 20. Upper member 21 is also preferably made of boron nitride.

Insulation 22, of quartz fiber batting, for example, surrounds the outer portions of chamber 11 and lid 13.

Lid 13 may be supported against the upper edge portions of chamber 11 by its weight and the weight of the members resting on it; however, it preferably is held more firmly in place by application of external force by any convenient means, indicated, in effect, by arrows F representing external leads applied on top of jacket 31. To assist in the engagement of lid 13 with chamber 11, the lid is bored to provide inner shoulder 45, which is dimensioned to fit closely adjacent the upper peripheral portions of chamber 11 while lid 13 rests upon the upper end of chamber 11.

A quartz pull rod 23, axially rotatable by means not shown at speeds in the range of 20–30 r.p.m., extends downwardly through the central cavity defined in annular upper cylindrical member 21 and in lid 13, including hub 17, with its lower end inside of chamber 11. The rod 23 has lower support provided by graphite bearing 25 and upper support by Teflon bearing 27, which bearings also serve as partial seals. Teflon bearing 27 is held in fixed position by a clamp or other conventional means, not illustrated.

Annular water-cooled jacket 31, with water feed line 33 and water outlet line 35, is located concentric with a diametrically reduced top portion of upper member 21, just under Teflon bearing 27. Jacket 31 provides cooling for Teflon bearing 27.

The lower portion of the chamber 11 is closed by bottom 41, which rests upon a circular recessed surface on the upper portion of base 42. Bottom 41 has central thermocouple receiving well 43 extending upwardly in its mid portion. Thermocouple 44 runs upwardly through base 42, with its junction in well 43.

Provisions for preventing air from entering chamber 11 through the partial seals provided by bearings 25 and 27 and through the partial seal provided by the sealing of lid 13 on chamber 11 will now be discussed. Upper annular member 21 is provided with a transverse passage 51, which is threaded to receive nipple 53. Nipple 53 and passage 51 thus permit communication therethrough to the central cavity in 21. Lid 13 has a depending annular skirt portion 55 in which is formed a passage receiving transversely oriented nipple 57. The internal diameter of skirt portion 55 is greater than the outer diameter of chamber 11 to define an annular cavity 59 with insulation 22 as the bottom surface bounding said cavity and the lower portion of shoulder 45 as the top bounding surface thereof. It will be noted that nipple 57 permits communication therethrough with the annular cavity 59. Both nipples 53 and 57 are connected to a supply of argon gas, not illustrated. When argon gas is permitted to flow through these nipples, air in the central cavity in upper annular member 21 and in annular cavity 59 is purged therefrom and replaced by an inert atmosphere of argon. Continuous flow of argon gas is permitted by the small amount of leakage occurring through the partial seal between Teflon bearing 27 and pull rod 23 and by leaking through the relatively porous insulation 22 defining the bottom surface bounding annular cavity 59. A protective envelope of argon is thus provided to keep out air.

Quartz support ring 61 extends upwardly from bottom wall 41 to support graphite susceptor 63, a generally cylindrical member having a hemispherical recess formed in its top which snugly receives hemispherical alumina cup 65. Note also that thermocouple well 43 extends upwardly into a recessed receiving portion in the bottom of graphite susceptor 63.

External of quartz chamber 11, but closely adjacent the walls thereof in the proximity of graphite susceptor 63, is RF heating coil 67.

The end of quartz pull rod 23 carries a small crystal of gallium arsenide, indicated at numeral 71, to serve as a seed for crystal growth. Crystal 71 is maintained in position by engagement in a slot in the end of the rod. A quartz pin passing through the end of the rod and through a mating opening formed in the seed may be used, if desired, to insure that the crystal stays in place.

The crucible 65 contains liquid gallium charge 73. Solid metallic arsenic 75 is disposed in the lower portions of the chamber 11 resting on bottom 41.

The above-described apparatus of FIGURE 1 may be used to pull gallium arsenide crystals. The formation of such crystals that do not contain the combination of chromium and a shallow acceptor is no part of this invention; however, the described apparatus may be used to make the novel gallium arsenide hereinabove described by the introduction of the specified impurities, as will now be described.

In operation, starting at room temperature, gallium 73 is placed in alumina cup 65 and chromium and shallow acceptor impurities such as zinc, manganese, cadmium ar magnesium addded thereto in proportions to be given later. Elemental metallic arsenic 75 is placed in the bottom of chamber 11. The apparatus of FIGURE 1 is then assembled as indicated therein with porous insulation 22 being applied.

Argon gas is introduced through side arm 12 and through nipples 53 and 57.

After purging air from chamber 11 with argon for a suitable time, for example 15 minutes, side arm 12 is sealed off, as by an oxyhydrogen torch. The flow of argon into nipples 53 and 57 is allowed to continue throughout the process. RF coil 67 is energized by a conventional energy source, not shown. Temperature is measured by thermocouple 44. Heating is continued over a period of about an hour until the melting point of gallium arsenide (1240° C.) or slightly above, preferably about 1250° C., is reached. The heat radiated from graphite susceptor 63 during the course of processing vaporizes the solid metallic arsenic 75 and reaction proceeds between the liquid gallium and the arsenic to form a melt of gallium arsenide. Thereafter, the rod 23 is moved downward until the crystal 71 contacts the surface of the gallium arsenide melt, which is at this time present in cup 65. The rod 23 is then retracted slowly, for example about 1½" per hour. During the course of this retraction the rod 23 is rotated at a spin rate of about 25–30 r.p.m. The temperature of the gallium arsenide melt is maintained at about 1240° C. during the course of the crystal pulling process.

All through the course of growing the crystal, the resistance heater 19 is operated to maintain the boron nitride surface at, or above, the condensation temperature of the vapor, thus maintaining an equilibrium pressure of the volatile component over the reaction melt in cup 65. Note that the system described does not depend on a gas-tight chamber. The loss of vapor through leaks is sufficiently slow to allow the growth of a large single crystal, the argon system providing the inert gas to insure that air is kept out. The pressure throughout processing is essentially atmospheric.

By the foregoing technique a crystal of gallium arsenide starts growing on the seed crystal 71 and continues growth as the pull rod is retracted. The crystal contains minor proportions of chromium and the shallow acceptor impurity dispersed throughout its structure.

The product of the foregoing technique is found to be a high quality monocrystalline compound comprising gallium arsenide with minor proportions of chromium and the shallow acceptor contained therein. The unique electrical characteristics of the compound are described hereinbelow.

The prior art predicts that the resistivity of semiconductor material doped with both a deep acceptor and a shallow acceptor in amounts sufficient to compensate the original donor concentration (usually about $10^{15}$ carriers/$cm.^3$) will be determined by the concentration of the shallow acceptor and controlled by the energy level or activation energy ($\Delta E$) associated with the shallow acceptor. Thus the prior art predicts that the resistivity of gallium arsenide doped with both a deep acceptor (such as chromium) and a shallow acceptor (such as manganese) in amounts sufficient to compensate or exceed the original donor concentration would be controlled by the energy level characteristic of the shallow acceptor (0.098 ev.).

In direct contrast to all suppositions and surmises, it has been discovered that the resistivity of gallium arsenide doped with both chromium and manganese is controlled by an energy level 0.3 ev. from the valence band which is intermediate the energy levels of chromium (0.75 ev.) and manganese (0.098 ev.).

Furthermore, the above described material can be produced with sufficiently high concentrations of chromium and shallow acceptor to provide monocrystalline material which not only is characterized by the 0.3 ev. energy level, but also a room temperature resistivity as low as 20 ohm-cm. or lower.

Now for a better understanding of this invention, the following specific examples should be considered.

Example 1

This example is given to show the resistivity characteristics of a high purity gallium arsenide crystal, formed without intentional addition of dopants.

The apparatus of FIGURE 1 was charged with 40 grams of gallium in the alumina cup 65. About 50 grams of metallic elemental arsenic was placed in the bottom of quartz chamber 11, thus providing a slight stoichiometric excess of arsenic. After flushing with argon for about 15 minutes, the side arm 12 was sealed off with a hot torch. Argon was continuously introduced through nipples 53 and 57 to provide an inert atmosphere adjacent sealing surfaces, as previously explained herein. Cooling water circulation was started and maintained through cooling jacket 31 during the course of processing.

The RF coil 67 was then activated and the temperature of the gallium raised slowly from room temperature to about 1250° C., the total heating process requiring about 1 hour. Boron nitride lid 13 was heated by resistance coil 19 all during processing as previously explained herein.

The rod 23 was lowered with its gallium arsenide seed crystal touching the surface of the melt in the alumina cup 65. It was rotated at a spin rate of about 25 revolutions per minute and was then retracted, while rotating, at the pull rate of about 1½" per hour. During the pulling process, the temperature was maintained at about 1240° C., just at the melting point of gallium arsenide. After a crystal of about 1½" in length had been pulled, the retracting rod was manually raised from the melt surface and the apparatus was allowed to cool, the argon flow adjacent the sealing surfaces being maintained so that any gas sucked into the chamber during the cooling process would be inert argon rather than air.

The crystal of gallium arsenide proved to be of good quality and to be substantially pure. It contained about 4 parts per million of aluminum, about 0.09 part per million iron, about 0.05 part per million silicon, about 0.01 part per million magnesium, and somewhat less than about 0.5 part per million calcium. Substantially all remaining material was accounted for as gallium arsenide. The aluminum present in the sample, although to a fairly high level relative to the other impurities, is inactive or neutral in this case. The aluminum resulted from the fact that an alumina crucible was used.

Resistivity measurement of the foregoing crystal gave a value of about 0.1 ohm-cm. at 300° Kelvin.

Repetition of the above example on several occasions gave a product with a resistivity ranging from about 0.02 to 0.1 ohm.-cm. at 300° Kelvin. In all cases the resulting material was N-type.

Example 2

The procedure of Example 1 was repeated, but this time about 100 milligrams of tin were added to the 40-gram charge of gallium and the heating process in the apparatus, accompanied by chemical reaction to form gallium arsenide, was repeated.

The crystal pulled by the same technique, under the same conditions, was quite similar in appearance to the product of Example 1. The monocrystalline product contained approximately 30 parts per million tin. It will be readily understood that the quantity of tin in the gallium arsenide crystal was substantially reduced from the ratio of tin to gallium in the charge crucible because of segregation phenomena. Except for the tin, substantially the same impurities in approximately the same amounts as in Example 1 were found to be present in the product.

The product was found to have a resistivity of about 0.01 ohm-cm. at 300° Kelvin.

Example 3

The procedure of Example 2 was repeated; however, in place of the tin, 100 milligrams of iron were added to the gallium in alumina cup 65.

The gallium arsenide crystal obtained from the pulling process was found to have a resistivity at 300° Kelvin of about $3\times10^4$ ohm-cm. Analysis of the crystal revealed that the actual iron content was approximately 0.5 per million, the analysis further showing the same impurities in substantially the same amount as in Examples 1 and 2.

A plot of Hall coefficient vs. temperature revealed that the conductivity of this material is controlled by an energy level about 0.5 ev. from the valence band. This is known to be the activation energy of iron in gallium arsenide.

Example 4

The procedure of Examples 2 and 3 was repeated, except that chromium was substituted for the tin and iron employed in those examples. The chromium, of high purity, was introduced into the gallium alumina cup 65. The quantity employed was about 100 milligrams.

After processing and crystal pulling in accordance with the same technique and under the same conditions employed in the prior examples, a gallium arsenide crystal of monocrystalline structure was obtained of about 1½" in length.

Analysis of the crystal of gallium arsenide showed it to be substantially pure, containing about 4 parts per million of aluminum, 0.05 part per million iron, 0.05 part per million silicon, and a trace of calcium. The chromium concentration level was approximately 0.5 part per million.

The resistivity of the product of this example was found to be approximately $3.5\times10^8$ ohm-cm. at 300° Kelvin. By plotting Hall coefficient vs. temperature, the $\Delta E$ of chromium was found to be 0.75 ev.

Example 5

The procedure of Example 4 was repeated, but with a charge of about 625 mgs. of chromium and about 11 mgs. of manganese. The gallium arsenide crystal obtained from the pulling process was found to contain about the same concentration level of other impurities as found in the prior example, but with a chromium concentration of about 9 parts per million (approximately $5.4\times10^{17}$ atoms/cm.$^3$) and a manganese concentration of about 1 part per million (approximately $5.7\times10^{16}$ atoms/cm.$^3$). The resistivity of the sample was approximately 34 ohm-cm. at 300° Kelvin.

A plot of Hall coefficient vs. temperature for this material revealed that the conductivity is controlled by an energy level 0.3 ev. from the valence band.

Example 6

The procedure of Example 4 was repeated, but with a charge of about 561 mgs. of chromium and about 3 mgs. of zinc. The gallium arsenide crystal obtained from the pulling process was found to contain about the same concentration level of other impurities as found in the prior examples, but with a chromium concentration of about 14 parts per million (approximately $8.4\times10^{17}$ atoms/cm.$^3$). The zinc was not detectable with emission spectrography but was determined to be approximately 17 parts per million (approximately $8.1\times10^{17}$ atoms/cm.$^3$). The resistivity of the sample was approximately 36 ohm-cm. at 300° Kelvin.

The resistivity vs. temperature characteristics of this material were determined by measuring the voltage drop across 0.5 cm. of a sample bar 0.25 cm.$\times$0.18 cm. at various temperatures. The data is tabulated in Table I.

A plot of Hall coefficient vs. temperature for this material also indicates an energy level 0.3 ev. from the valence band controlled the conductivity.

Example 7

The procedure of Example 4 was repeated, but with a charge of about 223 mgs. of iron and about 84 mgs. of copper replacing the chromium and zinc in Example 4. The gallium arsenide crystal obtained from the pulling process was found to contain about the same concentration level of other impurities as found in the prior example, but with an iron concentration of about 8 parts per million (approximately $4.5\times10^{17}$ atoms/cm.$^3$) and a copper concentration of about 0.4 part per million (approximately $1.9\times10^{16}$ atoms/cm.$^3$). The resisitivity of the sample was approximately 0.53 ohm-cm. at 360° Kelvin.

A plot of Hall coefficient vs. temperature indicated that the conductivity of this material is controlled by the copper level ($\Delta E = 0.15$ ev.) as would be predicted by the prior art.

TABLE I

| Temperature (° K.) | I (amp.) | Voltage Drop (v.) | Resistivity (ohm-cm.) |
|---|---|---|---|
| 126 | $1.8 \times 10^{-9}$ | 7.6 | $3.85 \times 10^{8}$ |
| 139 | $1.0 \times 10^{-8}$ | 11.6 | $1.04 \times 10^{8}$ |
| 145 | $9.8 \times 10^{-8}$ | 13.6 | $1.24 \times 10^{7}$ |
| 153 | $4.0 \times 10^{-7}$ | 14.0 | $3.15 \times 10^{6}$ |
| 164 | $1.5 \times 10^{-6}$ | 14.0 | $8.4 \times 10^{5}$ |
| 178 | $9.95 \times 10^{-6}$ | 14.0 | $1.26 \times 10^{5}$ |
| 185 | $2.2 \times 10^{-5}$ | 13.9 | $5.7 \times 10^{4}$ |
| 199 | $9.8 \times 10^{-5}$ | 13.7 | $1.26 \times 10^{4}$ |
| 202 | $1.05 \times 10^{-4}$ | 11.0 | $1.19 \times 10^{4}$ |
| 234 | $8.8 \times 10^{-4}$ | 7.0 | $1.13 \times 10^{3}$ |
| 253 | $2.1 \times 10^{-3}$ | 2.0 | $2.98 \times 10^{2}$ |
| 287 | $5.1 \times 10^{-3}$ | 2.0 | $3.5 \times 10$ |
| 312 | $5.8 \times 10^{-2}$ | 2.0 | 3.05 |

Referring to the above examples for comparative purposes, it is seen that doping with iron (Example 3) and chromium (Example 4) introduces a deep acceptor level at about 0.5 ev. and 0.75 ev., respectively, from the valence band. It is further seen that concurrently doping with iron and a shallow acceptor (Example 7) produces gallium arsenide having the characteristics of shallow acceptor doped material, that is, the resistivity is controlled by the normal shallow acceptor energy level. However, concurrently doping with chromium and a shallow acceptor (Examples 5 and 6) produces a material characterized by having an energy level at 0.3 ev. from the valence band regardless of the shallow acceptor impurity used.

The unique electrical characteristics of the above-described material make it particularly adaptable for use in making an improved thermistor, the preferred embodiment of which is shown in FIGURE 2. The thermistor of FIGURE 2 comprises an elongated body 90 of monocrystalline gallium arsenide of the characteristics described above, and leads 92 ohmically attached to opposite ends of the gallium arsenide body by any suitable means such as a platinum solder 91. Although the thermistor described has the general shape of a bar, no single particular configuration is required. It is only necessary that two leads be connected to a body of gallium arsenide having the above-described characteristics.

Thermistors as described above are unique in several respects. Since the gallium arsenide thermistor material is monocrystalline, a high degree of reproducibility in characteristics of devices can be obtained. Furthermore, gallium arsenide thermistors can be operated at temperatures as high as 600° Kelvin and higher without material deterioration of the thermistor body, while other thermistor materials disintegrate at even lower temperatures. Furthermore, even though the conductivity of the above-described material is controlled by an energy level of about 0.3 ev. the impurities which produce this energy level may be added in sufficient concentrations to provide relatively low resistivity material. Consequently, gallium arsenide thermistors made from this material have a much higher sensitivity at any given temperature than ordinary thermistors over a wide range of temperatures. Thus, gallium arsenide thermistors, as made from the material described above, have a high degree of sensitivity at temperatures as low as 77° Kelvin. Various other advantages will become readily apparent to those skilled in the art.

Having described the invention in connection with certain specific embodiments thereof, it is to be understood that further modifications will suggest themselves to those skilled in the art. It is to be understood that the form of this invention herewith shown and described is to be taken as a preferred example of the same and that various changes may be resorted to without departing from the spirit and scope of the invention as defined by the appended claims.

What is claimed is:

1. A semiconductor material consisting essentially of gallium arsenide doped with at least about $10^{15}$ atoms/cm.$^3$ of chromium and at least about $10^{15}$ atoms/cm.$^3$ of manganese, and having an energy level about 0.3 ev. from the valence band.

2. A semiconductor material consisting essentially of gallium arsenide doped with at least about $10^{15}$ atoms/cm.$^3$ of chromium and at least about $10^{15}$ atoms/cm.$^3$ of copper and having an energy level about 0.3 ev. from the valence band.

3. A semiconductor material consisting essentially of gallium arsenide doped with at least about $10^{15}$ atoms/cm.$^3$ of chromium and at least about $10^{15}$ atoms/cm.$^3$ of magnesium and having an energy level about 0.3 ev. from the valence band.

4. A semiconductor material consisting essentially of gallium arsenide doped with at least about $10^{15}$ atoms/cm.$^3$ of chromium and at least about $10^{15}$ atoms/cm.$^3$ of zinc and having an energy level about 0.3 ev. from the valence band.

5. A semiconductor material consisting essentially of gallium arsenide doped with at least about $10^{15}$ atoms/cm.$^3$ of chromium and at least about $10^{15}$ atoms/cm.$^3$ of cadmium and having an energy level about 0.3 ev. from the valence band.

6. A semiconductor material comprising gallium arsenide doped with about $5.4 \times 10^{17}$ atoms/cm.$^3$ of chromium and about $5.7 \times 10^{16}$ atoms cm.$^3$ of manganese, said semiconductor material having an energy level about 0.3 ev. from the valence band, and a resistivity of about 34 ohm-cm. at 300° Kelvin.

7. A semiconductor material comprising gallium arsenide doped with about $8.4 \times 10^{17}$ atoms/cm.$^3$ of chromium and about $8.1 \times 10^{17}$ atoms/cm.$^3$ of zinc, said semiconductor material having an energy level about 0.3 ev. from the valence band and a resistivity of about 36 ohm-cm. at 300° Kelvin.

References Cited

Gatos, Properties of Elemental and Compound Semiconductors, Inter-Science (1960), the article by Weisberg et al., pp. 48–53.

LEON D. ROSDOL, *Primary Examiner.*

J. D. WELSH, *Assistant Examiner.*